(12) United States Patent
Aflenzer et al.

(10) Patent No.: US 6,285,561 B1
(45) Date of Patent: Sep. 4, 2001

(54) DATA CARRIER MODULE DEVICE HAVING INTEGRATED CIRCUIT AND TRANSMISSION COIL CONNECTION CONTACTS COVERED BY A COMMON PROTECTIVE CAP

(75) Inventors: Günter Aflenzer, Unterpremstätten; Peter Schmallegger; Joachim Schober, both of Graz; Marcus Toth, Gratkorn, all of (AT)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/459,629

(22) Filed: Dec. 13, 1999

(30) Foreign Application Priority Data

Dec. 18, 1998 (EP) .................................................. 98890373

(51) Int. Cl.⁷ ...................................................... H05K 7/10
(52) U.S. Cl. ........................................... 361/767; 257/662
(58) Field of Search .................................. 257/662, 663, 257/691, 790, 679; 361/767, 782, 783, 737; 235/492, 488

(56) References Cited

U.S. PATENT DOCUMENTS

| | | | |
|---|---|---|---|
| 5,386,342 | * 1/1995 | Rosterko | 257/790 |
| 5,708,567 | * 1/1998 | Shim et al. | 361/723 |
| 5,801,440 | * 9/1998 | Chu et al. | 257/692 |
| 5,818,102 | * 10/1998 | Rostoker | 257/666 |
| 5,841,191 | * 11/1998 | Chie et al. | 257/691 |

FOREIGN PATENT DOCUMENTS

| | | | |
|---|---|---|---|
| 0123456-A2 | * 1/2000 | (EP) | 100/100 |
| 2743649 A | 7/1997 | (FR) | G06K/19/06 |
| WO9835452 | 8/1998 | (WO) | H04B/1/59 |

* cited by examiner

Primary Examiner—Brian Sircus
Assistant Examiner—Phuong K T Dinh
(74) Attorney, Agent, or Firm—Theodorus Mak

(57) ABSTRACT

The transmission coil (11) in a device (1) which includes a data carrier module (3) with a holding (4) and an integrated circuit (6) which is supported by the holding (4) and includes a transmission coil (11) which is electrically conductively connected to the integrated circuit (6) and to the holding (4), is covered, except for the area of its two coil connection contacts (13, 14), by a protective layer (16) of an electrically insulating material, a connection wire being provided between each coil connection contact (13, 14) and an associated circuit connection contact (7, 8), the integrated circuit (6) and the two connection wires (19, 20) and the areas of the two coil connection contacts (13, 14) which are not covered by the protective layer (16) being protectively covered by a single protective cap (10).

8 Claims, 1 Drawing Sheet

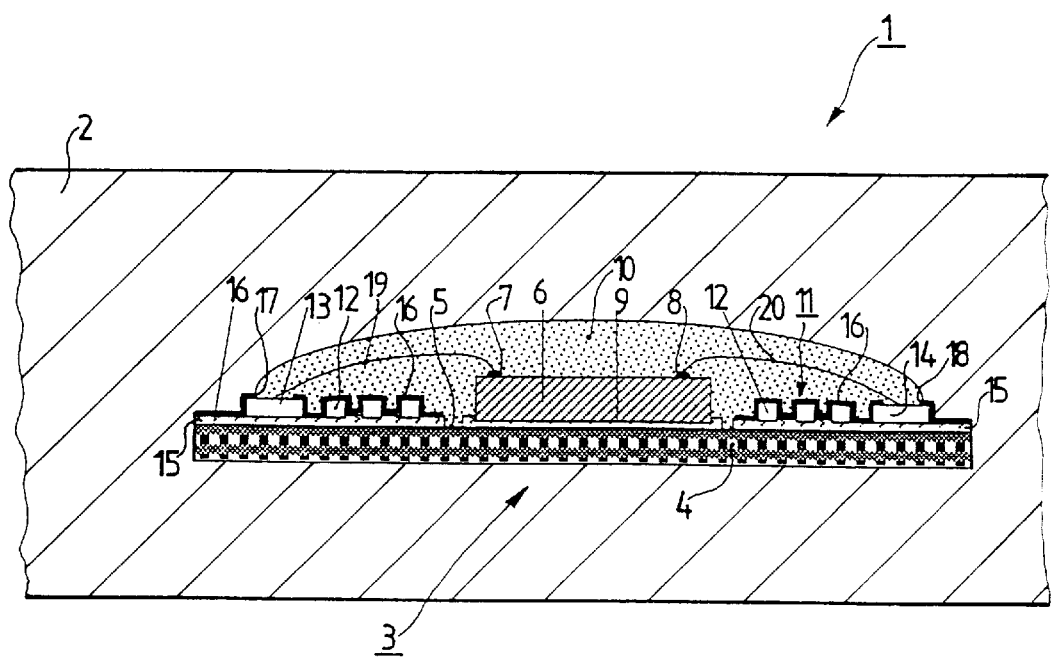

DATA CARRIER MODULE DEVICE HAVING INTEGRATED CIRCUIT AND TRANSMISSION COIL CONNECTION CONTACTS COVERED BY A COMMON PROTECTIVE CAP

FIELD OF THE INVENTION

The invention relates to a device with a data carrier module which is arranged for contractless communication with a communication station and includes a holding means and an integrated circuit which is arranged on the holding means at the area of a holding surface of the holding means and is provided with at least two circuit connection contacts, and also includes a protective cap of an electrically insulating material which protectively covers the integrated circuit and includes a transmission coil which is also arranged on the holding means at the area of the holding surface of the holding means and has at least one coil turn and two coil connection contacts, each of which is connected to a respective associated circuit connection contact.

The invention also relates to a data carrier module which is arranged for contactless communication with a communication station and includes a holding means and an integrated circuit which is arranged on the holding means at the area of a holding surface of the holding means and is provided with at least two circuit connection contacts, and also includes a protective cap of an electrically insulating material which covers the integrated circuit so as to protect it and includes a transmission coil which is also arranged on the holding means at the area of the holding surface of the holding means and has at least one coil turn and two coil connection contacts, each of which is connected to a respective associated circuit connection contact.

BACKGROUND OF THE INVENTION

A device of the kind set forth in the first paragraph and a data carrier module of the kind set forth in the second paragraph are known, for example from the patent document WO 98/35452 A1. The embodiment disclosed in the cited patent document concerns a clock which accommodates a data carrier module whose holding means is formed essentially by a printed circuit board which serves to hold a time display device and a clock chip as well as to hold a transponder chip and a transmission coil. The transmission coil therein is arranged fully unprotected on the printed circuit board acting as the holding means. Consequently, handling of the data carrier module during, for example, the building in into the clock, is liable to influence or damage or partially short-circuit coil turns of the transmission coil whereas when the data carrier module has already been mounted in the clock, contaminations or moisture could lead to partial short-circuiting of coil turns of the transmission coil. the data carrier module has already been mounted in the clock, contaminations or moisture could lead to partial short-circuiting of coil turns of the transmission coil.

It is an object of the invention to avoid the described problems and to provide, while using simple means, an improved device of the kind let forth in the first paragraph and an improved data carrier module of the kind set forth in teh second paragraph.

SUMMARY

In order to achieve this object, the transmission coil in a device of the kind set forth in the first paragraph according to the invention is covered by a protective layer of an electrically insulating material, a respective window being formed in the protective layer at the area of each of the two coil connection contacts and a connection wire being connected between each connection coil contact and its respective associated circuit connection contact, which connection wire is guided to the relevant coil connection contact via a window, the protecting cap protectively covering not only the integrated circuit but also the two connection wires and the two windows as well as the area of the two coil connection contacts which adjoin the two windows.

In order to achieve the above object in a data carrier of the kind set forth in the second paragraph according to the invention, the transmission coil is covered by a protective layer of an electrically insulating material, a window being formed in the protective layer at the area of each of the two coil connection contacts and a connection wire being connected between each coil connection contact and its associated circuit connection contact, which connection wire is guided to the relevant coil connection contact via a window, the protective cover protectively covering not only the integrated circuit but also the two connection wires and the two windows as well as the areas of the two coil connection contacts which adjoin the two windows.

Taking the steps according to the invention, it is very simply ensured that the integrated circuit as well as the connection wires to the coil connection contacts of the transmission coil and the transmission coil itself are very thoroughly protected, so that it is very reliably ensured, for a data carrier module according to the invention which has not yet been built into a device according to the invention as well as for a device according to the invention with a built-in data carrier module according to the invention, that no adverse effects can be exerted on the transmission coil and hence the faults or damage induced by such adverse effects are practically precluded. Taking the steps according to the invention, it is also ensured, because of the presence of the protective layer for the transmission coil, that undesirable short-circuits cannot occur between the connection wires and the coil turns of the transmission coil during the manufacture of the protective cap.

The holding means in a device according to the invention and in a data carrier module according to the invention, may be formed by means of different, electrically insulating materials. It has been found to be very advantageous, however, to take the steps disclosed in the Claims 2 and 6, because steps which are known per se from printed circuit board technology can thus be advantageously taken also for a device according to the invention and for a data carrier module according to the invention.

The protective layer and the protective cover for such a device according to the invention and such a data carrier module according to the invention may be made of different insulating materials. However, it has been found that it is particularly advantageous to take the steps disclosed in the Claims 3 and 4 as well as 7 and 8, because particularly good bonding conditions and hence particularly good properties in respect of strength and insulation are thus achieved.

The foregoing aspects and further aspects of the invention are apparent from and will be elucidated, by way of example, with reference to the embodiment described hereinafter.

BRIEF DESCRIPTION OF THE DRAWINGS

The invention will be described in detail hereinafter, by way of example, with reference to an embodiment as show in the drawing, however, without the invention being restricted hereto in any way.

The sole Figure is a cross-sectional view of an, in this context, essential part of an embodiment of a device according to the invention, in this case being a card-like data carrier in which an embodiment of a data carrier module according to the invention is accommodated.

DETAILED DESCRIPTION OF THE INVENTION

The sole Figure shows a part of a device according to the invention which is in this case formed by a card-like carrier 1. As regards the representation of the data carrier 1 it is to be noted that the data carrier 1 is shown at an enlarged scale, the thickness dimensions of the parts of the data carrier 1, moreover, being shown at an exaggerated scale so as to enhance the clarity.

The card-like data carrier 1 includes a card member 2 which is formed during an injection molding operation. However, the card member 2 may alternatively be formed by means of a known lamination process.

The card member 2 of the data carrier 1 accommodates a data carrier module 3. Like the complete data carrier 1, the data carrier module 3 is arranged, for contactless communication with a communication station as has been known since long.

The data carrier module 3 includes a holding means 4 which advantageously consists of a layer of fiberglass-reinforced epoxy material in the present case. The thickness of this layer amounts to approximately 100 μm. The data carrier module 3 also includes an integrated circuit 6 which is arranged on the holding means 4 at the area of a holding surface 5 of the holding means 4, said integrated circuit including two diagrammatically indicated circuit connection contacts 7 and 8. The integrated circuit 6 is connected to the holding means 4 at the area of the holding surface 5 by means of an adhesive layer 9.

The data carrier module 3 is provided with a protective cap 10 of an electrically insulating material. The protective cap 10 covers the integrated circuit 6 so that the integrated circuit 6 is protected. The protective cap 10 consists of a synthetic material, i.e. an epoxy material. In order to form the protective cap 10, the basic material for the protective cap 10 is deposited in a dosable state of aggregation by means of a dosing needle, after which curing takes place by thermal treatment. Curing may also be performed by way of UV irradiation.

The carrier module 3 is also provided with a transmission coil 11 which is also connected to the holding means 4 at the area of the holding surface of the holding means 4, said transmission coil having a plurality of coil turns 12 and two coil connection contacts 13 and 14. The coil turns 12 and the two coil connection contacts 13 and 14 of the transmission coil 11 are formed by layer-like conductor tracks of copper which are connected to the layer of fiberglass-reinforced epoxy material acting as the holding means 4. In order to establish this connection there is provided a further adhesive layer 15 which is formed by means of a non-conductive adhesive. The coil turns 12 and the two coil connection contacts 13 and 14 are formed, for example by means of an etching process, from a copper layer which initially covers the entire holding surface 5 of the holding means 4. However ,the transmission coil 11 may also be provided on the holding means 14 in a different way, for example by silk screen printing.

In the data carrier module 3, and hence also in the overall card-like data carrier 1, the transmission coil 11 is preferably covered by a protective layer 16 of an electrically insulating material. The protective layer 16 for the transmission coil 11 is particularly advantageously formed by means of a solder resist. The protective layer 16 for the transmission coil 11 is formed by a solder resist which essentially consists of an epoxy material. The thickness of the protective layer 16 lies in a range of from 10 to 20 μm.

The protective layer 16 is provided with a respective window 17, 18 at the area of each of the two coil connection contacts 13 and 14. Each of the two coil connection contacts 13 and 14 is connected to a respective associated circuit connection contact 7, 8, respectively; this connection is realized in that a connection wire 19, 20, respectively, is provided between each coil connection contact 13, 14 and its associated circuit connection contact 7, 8, said connection wire being guided from a circuit connection contact 7, 8 to the relevant coil connection contact 13, 14 via a window 17, 18.

The protective cap 10 of the data carrier module 3, and hence of the data carrier 1, is constructed in such a manner that the protective cap 10 advantageously covers not only the integrated circuit 6 protectively but also the two connection wires 19 and 20 and the two windows 17 and 18 as well as the areas of the two coil connection contacts 13 and 14 which adjoin the two windows 17 and 18.

In the described data carrier 1 and its data carrier module 2 it is simply ensured that the integrated circuit 6 and the connection wires 19 and 20 as well as the transmission coil 11 are suitably protected, so that the occurrence of disturbing short-circuits is precluded. Moreover, the protective cap 10 provides suitable mechanical protection not only for the integrated circuit 6 but also for the connection wires 19 and 20 and the coil connection contacts 13 and 14.

The invention has been described on the basis of a device in the form of a data carrier 1. However, it is to be noted that the steps according to the invention can also be carried out for other devices. For example, a device of this kind may be formed by a video recorder or other electronic entertainment apparatus, or also by a mobile telephone and a variety of other apparatus. A data carrier module according to the invention, or the integrated circuit that can be triggered in a contactless manner, can then be provided in the relevant device, for example for the purpose of product characterization or product assurance.

What is claimed is:

1. A device (1) with a data carrier module (3) which is arranged for contactless communication with a communication station, and includes a holding means (4), and an integrated circuit (6) which is arranged on the holding means (4) at the area of a holding surface (5) of the holding means (4) and is provided with at least two circuit connection contacts (7, 8), and also includes a protective cap (10) of an electrically insulating material which protectively covers the integrated circuit (6), and includes a transmission coil (11) which is also arranged on the holding means (4) at the area of the holding surface (5) of the holding means (4), and has at least one coil turn (12) and two coil connection contacts (13, 14), each of which is connected to a respective associated circuit connection contact (7, 8), characterized in that the transmission coil (11) is covered by a protective layer (16) of an electrically insulating material, and that a respective window (17, 18) is formed in the protective layer (16) at the area of each of the two coil connection contacts (13, 14), and that a connection wire (19, 20) is connected between each coil connection contact (13, 14) and its respective associated circuit connection contact (7, 8), which connection wire is guided to the relevant coil connection contact (13, 14) via a window (17, 18), and that the protective cap (10) protectively covers not only the integrated circuit (6) but also the two connection wires (19, 20) and the two windows (17, 18) as well as the areas of the two coil connection contacts (13, 14) which adjoin the two windows (17, 18).

2. A device (1) as claimed in claim 1, characterized in that the holding means (4) consists of a layer of fiberglass-reinforced epoxy material, and that the at least one coil turn (12) and the two coil connection contacts (13, 14) of the transmission coil (11) are formed by layer-like conductor tracks of copper which are connected to the layer of fiberglass-reinforced epoxy material which acts as the holding means (4), and that the protective layer (16) for the transmission coil (11) is formed by means of a solder resist.

3. A device (1) as claimed in claim 2, characterized in that the protective layer (16) for the transmission coil (11) is formed by means of a solder resist which consists essentially of an epoxy material.

4. A device (1) as claimed in claim 3, characterized in that the protective cap (10) is formed by means of an epoxy material.

5. A data carrier module (3) which is arranged for contactless communication with a communication station, and includes a holding means (4), and an integrated circuit (6) which is arranged on the holding means (4) at the area of a holding surface (5) of the holding means (4) and is provided with at least two circuit connection contacts (7, 8), and also includes a protective cap (10) of an electrically insulating material which protectively covers the integrated circuit (6), and includes a transmission coil (11) which is also arranged on the holding means (4), at the area of the holding surface (5) of the holding means (4), and has at least one coil turn (12) and two coil connection contacts (13, 14), each of which is connected to a respective associated circuit connection contact (7, 8), characterized in that the transmission coil (11) is covered by a protective layer (16) of an electrically insulating material, and that a respective window (17, 18) is formed in the protective layer (16) at the area of each of the two coil connection contacts (13, 14), and that a connection wire (19, 20) is connected between each coil connection contact (13, 14) and its respective associated circuit connection contact (7, 8), which connection wire is guided to the relevant coil connection contact (13, 14) via a window (17, 18), and that the protective cap (10) protectively covers not only the integrated circuit (6) but also the two connection wires (19, 20) and the two windows (17, 18) as well as the areas of the two coil connection contacts (13, 14) which adjoin the two windows (17, 18).

6. A data carrier module (3) as claimed in claim 5, characterized in that the holding means (4) consists of a layer of fiberglass-reinforced epoxy material, and that the at least one coil turn (12) and the two coil connection contacts (13, 14) of the transmission coil (11) are formed by layer-like conductor tracks of copper which are connected to the layer of fiberglass-reinforced epoxy material which acts as the holding means (4), and that the protective layer (16) for the transmission coil (11) is formed by means of a solder resist.

7. A data carrier module (3) as claimed in claim 6, characterized in that the protective layer (16) for the transmission coil (11) is formed by means of a solder resist which consists essentially of an epoxy material.

8. A data carrier module (3) as claimed in claim 7, characterized in that the protective cap (10) is formed by means of an epoxy material.

* * * * *